(12) United States Patent
Lee

(10) Patent No.: US 6,169,018 B1
(45) Date of Patent: Jan. 2, 2001

(54) FABRICATION METHOD FOR SEMICONDUCTOR DEVICE

(75) Inventor: Hi-Deok Lee, Cheongju (KR)

(73) Assignee: LG Semicon Co., Ltd., Choongcheongbuk-Do (KR)

(*) Notice: Under 35 U.S.C. 154(b), the term of this patent shall be extended for 0 days.

(21) Appl. No.: 09/114,290

(22) Filed: Jul. 13, 1998

(30) Foreign Application Priority Data

Feb. 7, 1998 (KR) ...................................... 98-6377

(51) Int. Cl.⁷ .............................................. H01L 21/3205
(52) U.S. Cl. ............................................ 438/587; 438/588
(58) Field of Search .............................. 438/587, 588, 438/585, 586, 591, 592, 593, 275

(56) References Cited

U.S. PATENT DOCUMENTS

| | | |
|---|---|---|
| 4,651,406 | 3/1987 | Shimizu et al. ........................ 29/571 |
| 5,057,449 | 10/1991 | Lowrey et al. ........................ 437/60 |
| 5,960,289 | * 10/1999 | Tsui et al. ............................ 438/275 |

* cited by examiner

*Primary Examiner*—David Nelms
*Assistant Examiner*—Quoc Hoang
(74) *Attorney, Agent, or Firm*—Morgan, Lewis & Bockius LLP

(57) ABSTRACT

The invention relates to a fabrication method of a semiconductor device having dual gates, and more particularly to a fabrication method of dual gates which respectively have a gate insulating film having a different thickness, which includes the steps of providing a semiconductor substrate having a first region and a second region; sequentially forming a first insulating film and an oxidizable film on the first region of the substrate; and forming a second insulating film on the second region of the substrate. Since, when forming the second insulating film, the oxidizable film becomes an oxide film, which oxide film is combined with the first insulating film, thus forming the first gate insulating film, the first gate insulating film is formed thicker than the second gate insulating film in accordance with a simplified oxidation process.

6 Claims, 2 Drawing Sheets

FABRICATION METHOD FOR SEMICONDUCTOR DEVICE

BACKGROUND OF THE INVENTION

1. Field of the Invention

The present invention relates to a fabrication method for a semiconductor device having dual gates, and more particularly to a fabrication method for dual gates which have gate insulating films having a different thickness.

2. Discussion of the background

FIGS. 1A to 1D are vertical cross-sectional diagrams illustrating a fabrication method for dual gates of a conventional semiconductor device.

First, in FIG. 1A, a first insulating film 12, an oxide film, and a first poly silicon layer 13 are sequentially formed on a semiconductor substrate 11, and a predetermined portion of the first insulating film 12 and the first poly silicon layer 13, in which a second gate insulating film 14a is to be formed is removed.

In FIG. 1B, a second insulating film 14 which is an oxide film and a second poly silicon layer 15 are sequentially formed on the first poly silicon film 13 and the semiconductor substrate 11. Here, the first insulating film 12 and the second insulating film 14 have a different thickness.

In FIG. 1C, a portion of the second insulating film 14 and the second poly silicon layer 15, which is above the first poly silicon layer 13 is removed, and, as shown in FIG. 1D, by performing a gate patterning process there are formed a first gate insulating film 12a formed of the first insulating film 12, a first gate electrode 13a of the first poly silicon film 13, a second gate insulating film 14a of the second insulating film 14, and a second gate electrode 15a of the second poly silicon layer 15. Here, the first gate insulating film 12a and the second gate insulating film 14a have a different thickness.

According to the conventional fabrication method for the dual gates of the semiconductor device, when forming the second insulating film 14, a portion of the second insulating film 14, the oxide film, formed on the first poly silicon layer 13 is formed thicker than the other portion thereof formed on the semiconductor substrate 11. Accordingly, a surface of the semiconductor substrate 11 beneath the first insulating film 12 has a tendency to be damaged while removing the portion of the second insulating film 14 formed on the first poly silicon layer 13. In addition, when forming the second insulating film 14, the first-formed poly silicon layer 13 passes through a high temperature condition, thus a grain size of the first poly silicon layer 13 becomes extremely enlarged so that an additional silicon ion implantation process is required.

SUMMARY OF THE INVENTION

Accordingly, the present invention is directed to a fabrication method for a semiconductor device that obviates the problem due to the related art.

An object of the present invention is to provide a fabrication method for a semiconductor device that improves reliability of a semiconductor device having dual gates and simplifies a manufacturing process thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a fabrication method for a semiconductor device includes the steps of: providing a semiconductor substrate having a first region and a second region; sequentially forming a first insulating film and an oxidizable film on the first region of the substrate; forming a second insulating film on the second region of the substrate; forming a conductive layer on the second insulating film and the oxidizable film; and patterning the first insulating film, second insulating film, oxidizable film and conductive layer, for thereby forming a first gate insulating film, a first gate electrode, a second gate insulating film and a second gate electrode.

In the invention, when forming the second insulating film, the oxidizable film becomes an oxide film, which oxide film is combined with the first insulating film, for thereby forming the first gate insulating film.

The conductive layer is formed of either a multi-crystalline silicon or an amorphous silicon.

The insulating film is formed of either an oxide film, an oxide-nitride film, or a combination film of the oxide film and the oxide-nitride film, and a thickness thereof is about 10–100 Å.

The oxidizable film is formed of either a multi-crystalline silicon or an amorphous silicon, and a thickness thereof is about 10–100 Å.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

FIGS. 2A to 2D are vertical cross-sectional diagrams illustrating a fabrication method for dual gates of a semiconductor device according to the present invention.

Figure 1A:
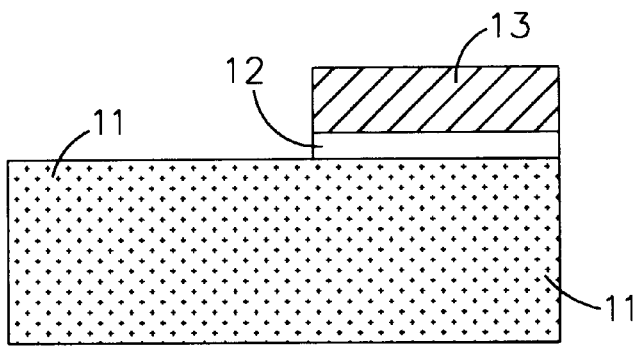
FIGS. 1A to 1D are vertical cross-sectional diagrams illustrating a fabrication method for dual gates of a conventional semiconductor device.
Figure 1B:
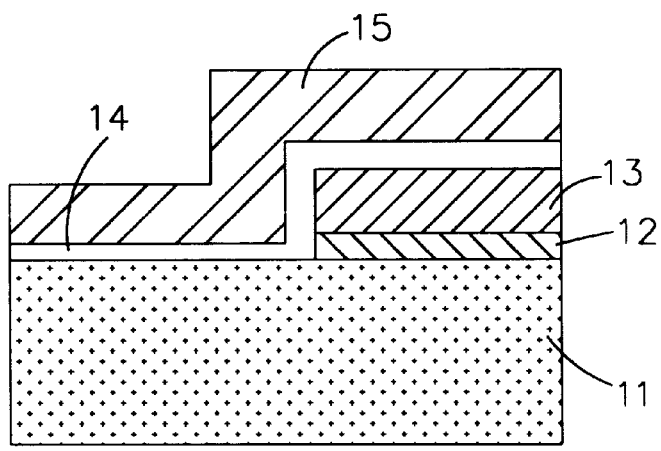
Figure 1C:
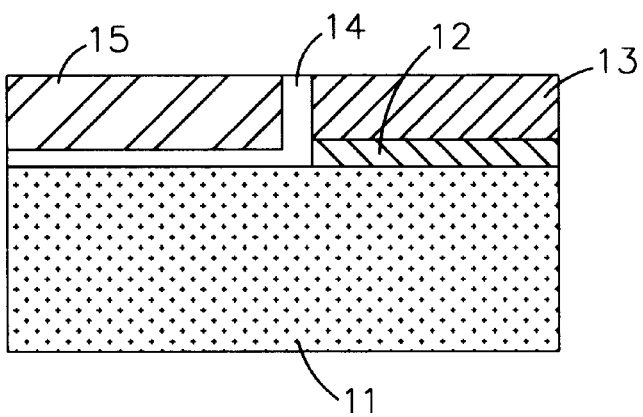
Figure 1D:
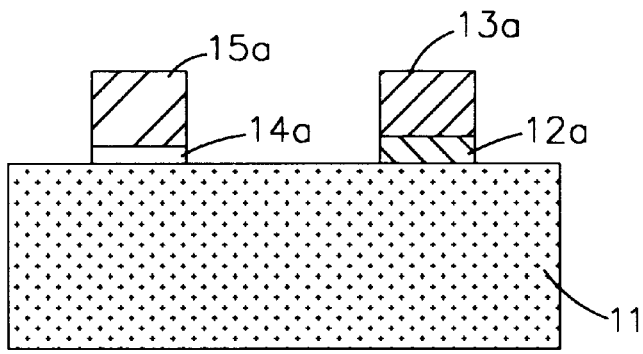
Figure 2A:
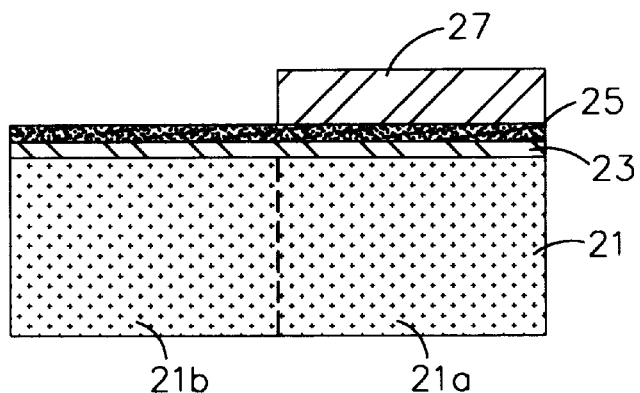
FIGS. 2A to 2D are vertical cross-sectional diagrams illustrating a fabrication method for dual gates of a semiconductor device according to the present invention.

First, in FIG. 2A, there is provided a semiconductor substrate 21 having a first region 21a and a second region 21b, on which insulating films which have a different thickness will be respectively formed.

A first insulating film 23 formed of either an oxide film, an oxide-nitride film, or a combination film of the two films, is formed on an entire surface of the substrate 21 at a thickness of 10–100 Å, and an oxidizable film 25 of either a multi-crystalline silicon or an amorphous silicon is formed on the first insulating film 23. Next, a photoresist pattern layer 27 is formed on the oxidizable film 25, corresponding to the first region 21a of the semiconductor substrate 21.

Figure 2B:
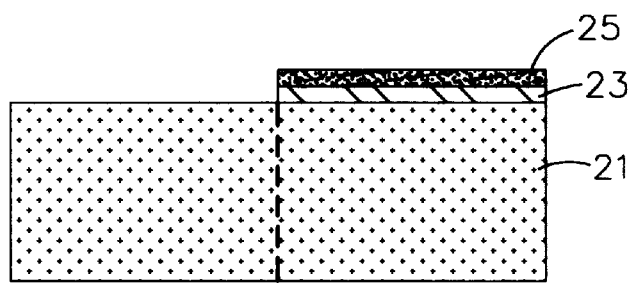

In FIG. 2B, a portion of the oxidizable film 25 and the first insulating film 23 are removed by using the photoresist pattern layer 27 as a mask, thereby exposing an upper surface of the second region 21b of the semiconductor substrate 21. Next, the photoresist pattern layer 27 is removed.

Figure 2C:
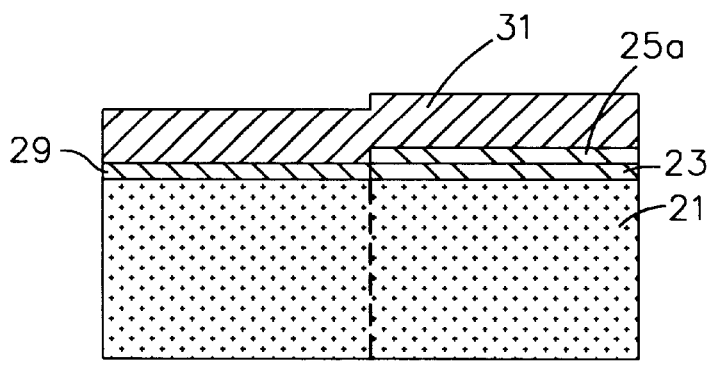

In FIG. 2C, a second insulating film 29, which is formed of the same material as the first insulating film 23, is formed on the second region 21b of the semiconductor substrate 21 at a thickness of 10–100 Å. Here, the oxidizable film 25 is oxidized and becomes an oxide film 25a. A conductive layer 31 which is formed of a multi-crystalline silicon or an amorphous silicon and to be a gate electrode is formed on the second insulating film 29 and the oxide film 25a.

Figure 2D:
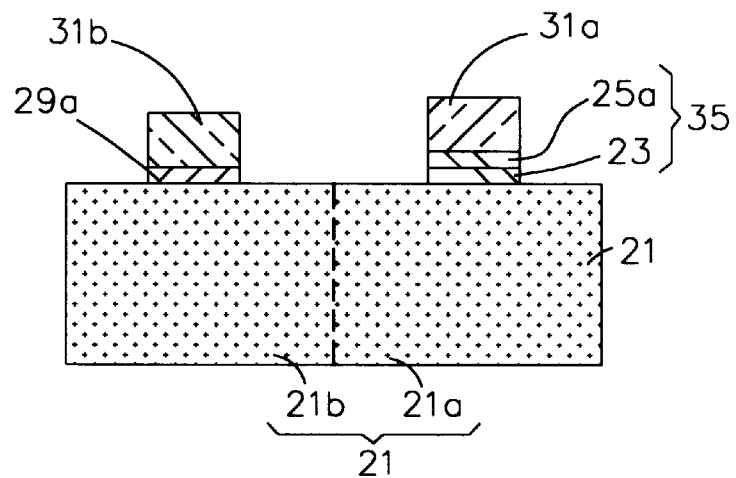

In FIG. 2D, a photoresist pattern (not shown) is formed on an upper surface of the conductive layer 31 and a patterning process is performed by using the photoresist pattern as a mask, thus forming a first gate insulating film 35, a second gate insulating film 29a, a first gate electrode 31a, and a second gate electrode 31b. The first gate insulating film 35 is formed by which the first insulating film 23 and the oxide film 25a are combined, and the second gate insulating film 29a is formed by which the second insulating film 29 is patterned. The first gate electrode 31a and the second gate electrode 31b are respectively formed by which the conductive layer 31 is patterned. The first gate insulating film 35 is formed thicker than the second gate insulating film 29a as 10–100 Å, that is the thickness of the oxide film 25a. Accordingly, the first region 21a of the semiconductor device having the first gate insulating film 35 has high resisting pressure property, thus being suitable for an interface section which connects the semiconductor device to external devices.

As described above, since the insulating films having a different thickness are respectively formed on the first and second regions of the semiconductor substrate, the fabrication method for the semiconductor device according to the present invention simplifies the manufacturing process and prevents damage of the surface of the substrate. Also, according to the invention, the conductive layer does not pass through a high temperature condition which is required when forming the oxide film since the conductive layer which is to be the gate electrodes is formed after the insulating films having a different thickness are completely formed. Therefore, the invention prevents the grain size of the conductive layer from being enlarged, thus improving the reliability of the semiconductor device.

It will be apparent to those skilled in the art that various modifications and variations can be made in the fabrication method for the semiconductor device of the present invention without departing from the spirit or scope of the invention. Thus, it is intended that the present invention cover the modifications and variations of this invention provided they come within the scope of the appended claims and their equivalents.

What is claimed is:

1. A fabrication method for a semiconductor device, comprising:

providing a semiconductor substrate having a first region and a second region;

sequentially forming a first insulating film and an oxidizable film on the first region of the substrate;

forming a second insulating film on the second region of the substrate;

forming a conductive layer on the second insulating film and the oxidizable film; and patterning the first insulating film, second insulating film, oxidizable film and conductive layer, for thereby forming a first gate insulating film, a first gate electrode, a second gate insulating film and a second gate electrode, and wherein when forming the second insulating film, the oxidizable film becomes an oxide film, which oxide film is combined with the first insulating film, for thereby forming the first gate insulating film.

2. The method of claim 1, wherein the conductive layer is formed of a multi-crystalline silicon or an amorphous silicon.

3. The method of claim 1, wherein each of the first and second insulating films is formed of either an oxide film, an oxide-nitride film, or a combination film of the oxide film and the oxide-nitride film.

4. The method of claim 3, wherein each thickness of the first and second insulating films is approximately 10–100 Å.

5. The method of claim 1, wherein the oxidizable film is formed of a multi-crystalline silicon or an amorphous silicon.

6. The method of claim 5, wherein a thickness of the oxidizable film is approximately 10–100 Å.

* * * * *

UNITED STATES PATENT AND TRADEMARK OFFICE
CERTIFICATE OF CORRECTION

PATENT NO. : 6,169,018 B1
DATED : January 2, 2001
INVENTOR(S) : Hi-Deok Lee

It is certified that error appears in the above-identified patent and that said Letters Patent is hereby corrected as shown below:

<u>Title page,</u>
Item [30], Foreign Application Priority Data, please change "Feb. 7, 1998" to
-- Feb. 27, 1998 --

Signed and Sealed this

Sixth Day of April, 2004

JON W. DUDAS
*Acting Director of the United States Patent and Trademark Office*